United States Patent [19]

Lloyd

[11] Patent Number: 5,737,768
[45] Date of Patent: Apr. 7, 1998

[54] METHOD AND SYSTEM FOR STORING DATA BLOCKS IN A MEMORY DEVICE

[75] Inventor: Scott E. Lloyd, Hoffman Estates, Ill.

[73] Assignee: Motorola Inc., Schaumberg, Ill.

[21] Appl. No.: 808,225

[22] Filed: Feb. 28, 1997

Related U.S. Application Data

[63] Continuation of Ser. No. 288,385, Aug. 10, 1994, abandoned.

[51] Int. Cl.[6] ............................................ C06F 12/06
[52] U.S. Cl. ........................................ 711/173; 711/111
[58] Field of Search ................................ 711/173, 111

[56] References Cited

U.S. PATENT DOCUMENTS

| | | | |
|---|---|---|---|
| 3,748,451 | 7/1973 | Ingwersen | 235/156 |
| 4,286,329 | 8/1981 | Goertzel et al. | 364/900 |
| 4,547,882 | 10/1985 | Tanner | 371/37.4 |
| 4,667,300 | 5/1987 | Guilfoyle | 364/713 |
| 4,667,308 | 5/1987 | Hayes et al. | 365/230.02 |
| 4,819,152 | 4/1989 | Deerfield et al. | 364/200 |
| 4,914,615 | 4/1990 | Karmarkas et al. | 364/754 |
| 4,959,776 | 9/1990 | Deerfield et al. | 364/200 |
| 5,136,538 | 8/1992 | Karmarkar et al. | 364/754 |
| 5,168,375 | 12/1992 | Reisch et al. | 358/432 |
| 5,301,342 | 4/1994 | Scott | 395/800 |
| 5,408,588 | 4/1995 | Ulug | 395/23 |

*Primary Examiner*—David L. Robertson
*Attorney, Agent, or Firm*—Bruce E. Stuckman; Michael K. Lindsey

[57] ABSTRACT

A method and system for storing a plurality of data blocks in a memory device is disclosed. The method stores two blocks of data elements by assign different accessing methods to the two data blocks. Three example methods of accessing the data blocks are provided by the method. The first method allows data elements of a data block to be accessed by columns in the address space, the second allows data elements to be accessed by rows in the address space, and the third allows data elements to be accessed along diagonals in the address space. The data elements may be digital words which represent exponents of a polynomial expansion.

29 Claims, 6 Drawing Sheets

— PRIOR ART —

METHOD AND SYSTEM FOR STORING DATA BLOCKS IN A MEMORY DEVICE

This is a continuation of application Ser. No. 08/288,385, filed Aug. 10, 1994 and now abandoned.

RELATED INVENTIONS

The present invention is related to the following inventions which are assigned to Motorola Inc., the same assignee as the present invention:

(1) "Neural Network and Method of Using Same", having Ser. No. 08/076,601 filed Jun. 14, 1993.

(2) "Method and System for Storing Data in a Memory Device", having Ser. No. 08/296,042, Aug. 23, 1994, filed concurrently herewith.

(3) "Method and System for Data Storage", having Ser. No. 08/288,673, Aug. 10, 1994, filed concurrently herewith now U.S. Pat. No. 5,548,752.

The subject matter of the above-identified related inventions is hereby incorporated by reference into the disclosure of this invention.

TECHNICAL FIELD

This invention relates generally to data storage systems and, in particular, to a method and system for storing data in a memory device.

BACKGROUND OF THE INVENTION

Data storage systems are widely used in a variety of computing environments. FIG. 1 shows a computer (10) which includes a data storage system (14). Typically, a data storage system includes a mass storage (16), a memory management unit (MMU) (22), and a central processing unit (CPU) memory (24). The CPU (12) executes software programs and is connected to memory management unit (22) and CPU memory (24) via bus (20).

Memory management unit (22) controls the transfer of data between mass storage (16) and CPU memory (24), and in some instances it may transfer data between central processing unit (12) and mass storage (16). To move data from mass storage (16) to CPU memory (24), memory management unit (22) reads data blocks from mass storage (16) using bus (18) and then writes the data blocks to CPU memory (24) using bus (20). In a similar fashion, memory management unit (22) may move data blocks from CPU memory (24) to mass storage (16) by first reading the data blocks from CPU memory (24) and then writing them to mass storage (16).

Mass storage (16) typically provides a means for storing large quantities of data at relatively low cost per stored data element. One of ordinary skill in the art will realize that mass storage (16) may comprise a hard disk, an array of random access memory (RAM) chips, or other storage media.

CPU memory (24) stores data and program instructions which are used by CPU (12). One of ordinary skill in the art will understand that CPU memory (24) may be a static or cache RAM which resides on the same integrated circuit as CPU (12). The data stored in CPU memory (24) is accessed by CPU (12) across bus (20). CPU memory (24) allows quicker access to stored data than mass storage (16). However, CPU memory (24) is generally small due to the relatively high cost associated with memory capable of short access times. CPU memory (24) is generally not large enough to store all of the data needed by CPU (12) during operation. Thus, either CPU (12) must periodically access data from mass storage (16) through memory management unit (22), or memory management unit (22) must periodically update the contents of CPU memory (24). Since mass storage (16) is slower than CPU memory (24), CPU (12) must insert wait states while accessing data from mass storage (16). The insertion of wait states by CPU (12) decreases the overall performance of computer (10). Additionally, in many situations the amount of time required by memory management unit (22) to load data blocks into CPU memory (24) causes CPU (12) to idle, which also decreases the performance of computer (10).

Therefore, there is a significant need for a data storage system which allows data blocks to be stored in a manner that reduces the overall required size of the memory. There is also a need for a data storage system which reduces the swapping of data blocks between the memory and mass storage.

SUMMARY OF THE INVEMTION

It is thus an advantage of the present invention to provide a method for reducing the amount of memory space needed to store data in a memory device.

A further advantage of the present invention is that a method is provided which lessens the need to swap data blocks between a memory device and a mass storage device.

In one embodiment of the present invention there is provided a method of storing a plurality of data blocks in a memory device. In this method, the plurality of data blocks has a first and second data block. The first step of this method stores the first data block in the memory device so that the first data block is accessible using a first accessing method. The second step stores the second data block in the memory device so that the second data block is accessible using a second accessing method.

In an alternative embodiment of the present invention, a method of storing a plurality of data blocks in a memory device is provided. In this method, each of the data blocks has a plurality of data elements and the plurality of data blocks has a first and second data block. The first step of this method stores the first data block in the memory device so that the first data block is accessible using a first accessing method. The second step stores the second data block in the memory device so that the second data block is accessible using a second accessing method, and if a common data element exists between the first and second data blocks, the common data element of the first and second data blocks is stored in a single area in the memory device.

In another embodiment of the present invention, there is provided a method of storing a plurality of data blocks in a memory device. In this method, each of the data blocks has a plurality of data elements. Additionally, this method includes the following steps. The first step assigns to each of the plurality of data blocks an accessing method; the second step determines the number of common data elements amongst the plurality of data blocks; the third step changes the accessing method of at least one of the plurality of data blocks; the forth step repeats second and third steps until the greatest number of common data elements amongst the plurality of data blocks is found; and the fifth step stores the plurality of data blocks in the memory device so that each of the plurality of data blocks is accessible using the accessing method assigned which allows the greatest number of common data elements amongst the plurality of data blocks.

In a further embodiment of the present invention, a memory management unit is provided for storing a plurality of data blocks in the memory device of a computer. The plurality of data blocks has a first and second data block, and each of the plurality of data blocks has a plurality of data elements. The memory management unit includes a first storing means operatively coupled to the memory device, for storing the first data block in the memory device so that the first data block is accessible using a first accessing method. In addition, the memory management unit includes a second storing means which is operatively coupled to the memory device and cooperative with the first storing means. The second storing means is for storing the second data block in the memory device so that the second data block is accessible using a second accessing method. Additionally, if a common data element exists between the first and second data blocks, the common data element of the first and second data blocks is stored in a single area in the memory device.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF A PREFERRED EMBODIMENT

It will be understood by one of ordinary skill in the art that the methods of the present invention may be implemented in hardware or software, or any combination thereof, and that the terms, "exponent", and "exponent value", as well as the terms, "block", and "data block", are used interchangeably in this description.

Figure 1:
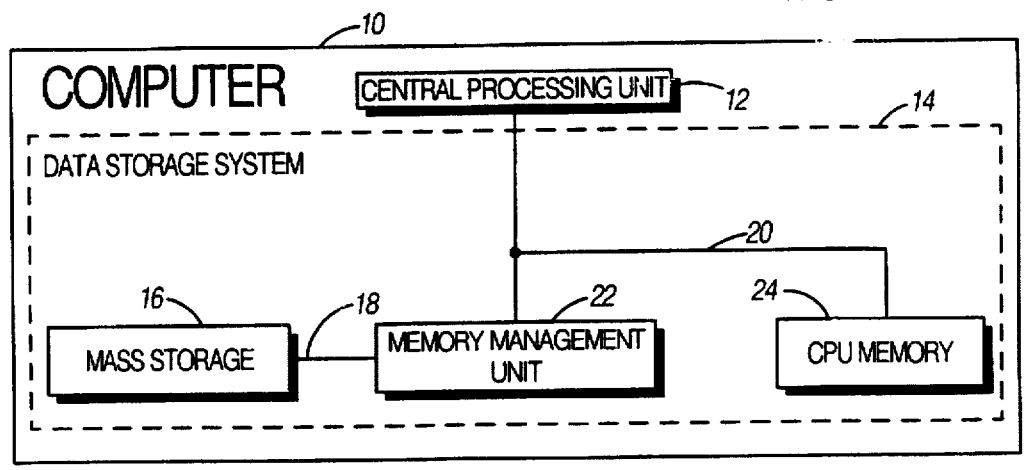
FIG. 1 shows a block diagram of a prior art computer which includes a data storage system.
Figure 2:
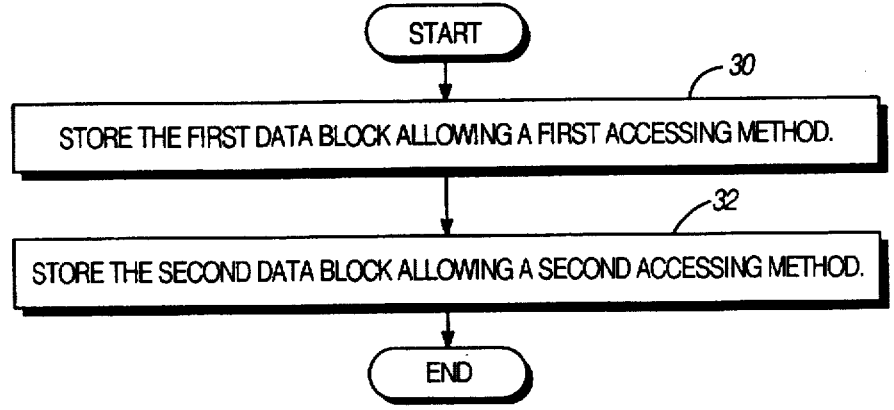
FIG. 2 shows a flow diagram of a method of storing two of a plurality of data blocks in a memory device.

FIG. 2 shows a flow diagram of a method of storing two of a plurality of data blocks in a memory device in accordance with one embodiment of the present invention. In box (30), a first data block, from the plurality of data blocks, is stored in the memory device in a manner which allows the data block to be accessed using a first accessing method.

In box (32), a second data block, from the plurality of data blocks, is stored in the memory device in a manner which allows the data block to be accessed using a second accessing method.

The storage of data blocks using different accessing methods can allow flexibility in placing the data blocks, which can, in turn, allow two or more data blocks to be arranged in memory with less space. The use of less space, in turn, reduces the potential for swapping data blocks between a memory device and a mass storage device.

In the present invention, the first and second accessing methods are different from one another. For example, the first accessing method may be a horizontal accessing method while the second method may be a vertical; or the first method may be horizontal method while the second method is a diagonal method. Thus, one with ordinary skill in the art will recognize that other accessing methods and other combinations thereof may likewise be employed.

It will be apparent to those skilled in the art that the first and second data blocks are arbitrarily selected from the plurality of data blocks and that labeling the two data blocks as first and second does not necessarily imply sequential ordering of the plurality of data blocks.

Figure 3:
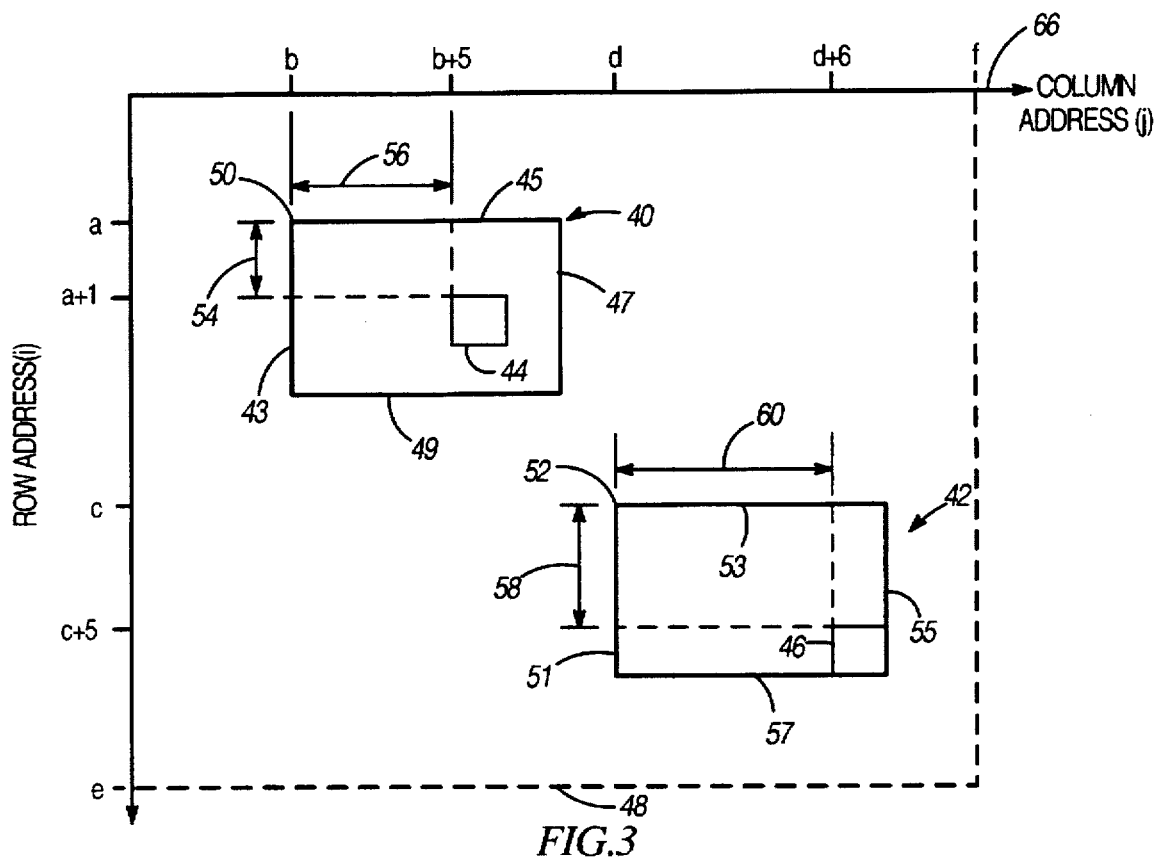
FIG. 3 illustrates an example of a two-dimensional addressing scheme which is used by an embodiment of the present invention.

FIG. 3 illustrates an example of a two-dimensional addressing scheme which is used to locate data in a memory device. In one embodiment of the present invention, addresses in a memory device are represented by an array which has two indices: a row address and a column address. Thus, a two-dimensional address may be represented as an ordered pair (i,j), where i represents the row address and j represents the column address. A data element may be stored at each two-dimensional address in the memory device.

Axis (64) represents values of the row address, while axis (66) represents values of the column address. Boundary (48) indicates the memory space of a memory device. A data element may be stored anywhere within the memory space of a memory device. In other words, the two-dimensional address of a data element stored within boundary (48) may be given by (i,j), where $0 \leq i \leq e$, and $0 \leq j \leq f$.

Data block (40) comprises a plurality of data elements, one of which is shown as data element (44). Data block (40) is referenced by two-dimensional origin address (50). Origin address (50) gives the location of the first data element of data block (40). The first data element is accessed before other data elements of the block. Origin address (50) is given by the ordered pair (a, b). All other data elements within a data block are located at addresses which are relative to the origin address of the data block. For example, the row address of data element (44) is given by the sum of row offset (54) and the row address of origin address (50), and the column address of data element (44) is given by the sum of column offset (56) and the column address of origin address (50). In the example, row offset (54) equals one location and column offset (56) equals five locations. Thus, the resulting two-dimensional address of data element (44) is (a+1, b+5).

The first boundary of data block (40) comprises boundary (43) and boundary (49). Boundary (43) is given by the column minimum address of data block (40). The data elements of data block (40) which are located along this boundary have column addresses which are equal to the column minimum address of data block (40). Boundary (49) is given by the row maximum address of data block (40). The data elements of data block (40) which are located along boundary (49) have row addresses which are equal to the row maximum address of data block (40).

The second boundary of data block (40) comprises boundary (45) and boundary (47). Boundary (45) is given by the row minimum address of data block (40). The data elements of data block (40) which are located along this boundary have row addresses which are equal to the row minimum address of data block (40). Boundary (47) is given by the column maximum address of data block (40). The data elements of data block (40) which are located along boundary (47) have column addresses which are equal to the column maximum address of data block (40).

Data block (42) is referenced by origin address (52) which is represented by the ordered pair (c, d). Maximum row offset (58) and maximum column offset (60) give the two-dimensional address of data element (46) relative to origin address (52). Together, the maximum row offset and maximum column offset represent the relative address of the last data element of a data block to be accessed. For example, maximum row offset (58) is equal to five locations and maximum column offset (60) is equal to six locations. Thus the resulting two-dimensional address for data element (46) is (c+5, d+6).

The first boundary of data block (42) comprises boundary (51) and boundary (57). Boundary (51) is given by the column minimum address of data block (42). The data elements of data block (42) which are located along this boundary have column addresses which are equal to the column minimum address of data block (42). Boundary (57) is given by the row maximum address of data block (42). The data elements of data block (42) which are located along boundary (57) have row addresses which are equal to the row maximum address of data block (42).

The second boundary of data block (42) comprises boundary (53) and boundary (55). Boundary (53) is given by the row minimum address of data block (42). The data elements of data block (42) which are located along this boundary have row addresses which are equal to the row minimum address of data block (42). Boundary (55) is given by the column maximum address of data block (42). The data elements of data block (42) which are located along boundary (55) have column addresses which are equal to the column maximum address of data block (42).

Figure 4:
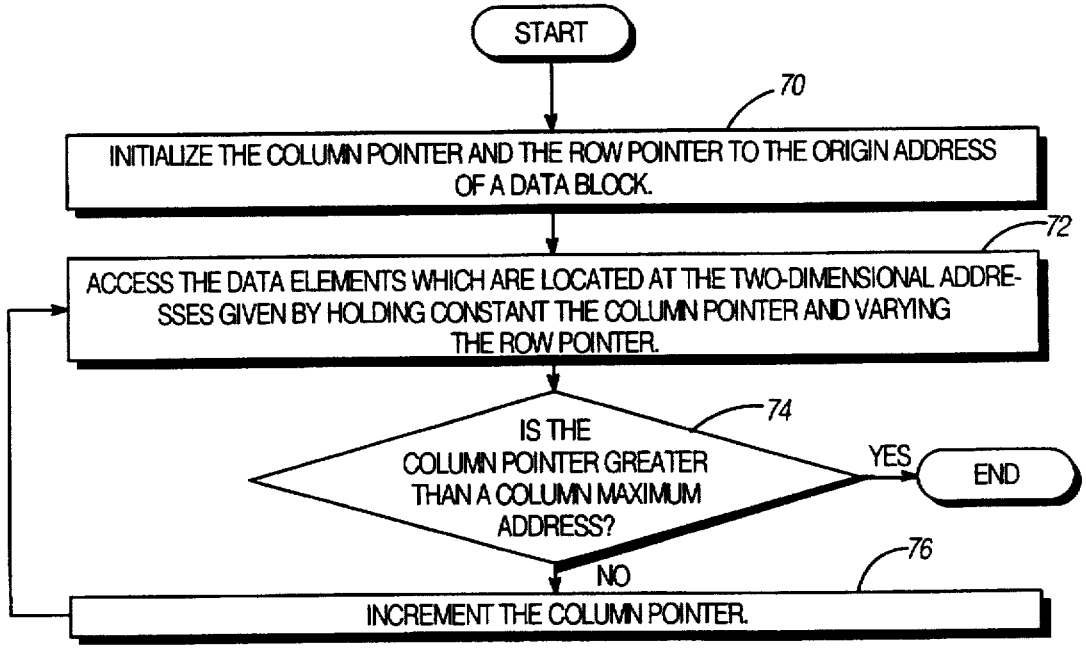
FIG. 4 shows a flow diagram of a method of column accessing data elements in a data block in accordance with an embodiment of the present invention.

FIG. 4 shows a flow diagram of a method of column accessing data elements in a data block in accordance with one embodiment of the present invention. In box (70), a column pointer and row pointer are initialized to an origin address of a data block which is stored in the memory device. The column and row pointers are loadable counters or any other storage means which retain the column and row addresses, respectively, and allow the addresses to be periodically updated by either incrementing or decrementing. The column and row pointers provide the two-dimensional address of the data element which is currently being accessed.

Next, in box (72), a column of data elements in the data block is accessed. A column of data elements is defined as those elements which have the same column address. Data elements in a column are accessed by holding constant the column address given by the column pointer and then varying the row address from the row minimum address to the row maximum address. The row address may be varied by incrementing the contents of the row pointer. It will be apparent to one of ordinary skill in the art that the row address may also be varied from the row maximum address to the row minimum address by decrementing the contents of the row pointer. Additionally, it will be understood by one of ordinary skill that data elements located in the same column may be simultaneously accessed.

In decision box (74), a check is made to determine whether the column address given by the column pointer is greater than the column maximum address. If so, the method terminates. If not, the method proceeds to box (76).

In box (76), the contents of the column pointer are incremented. This allows the next column of the data block to be accessed. Upon exiting box (76), method returns to box (72).

Figure 5:
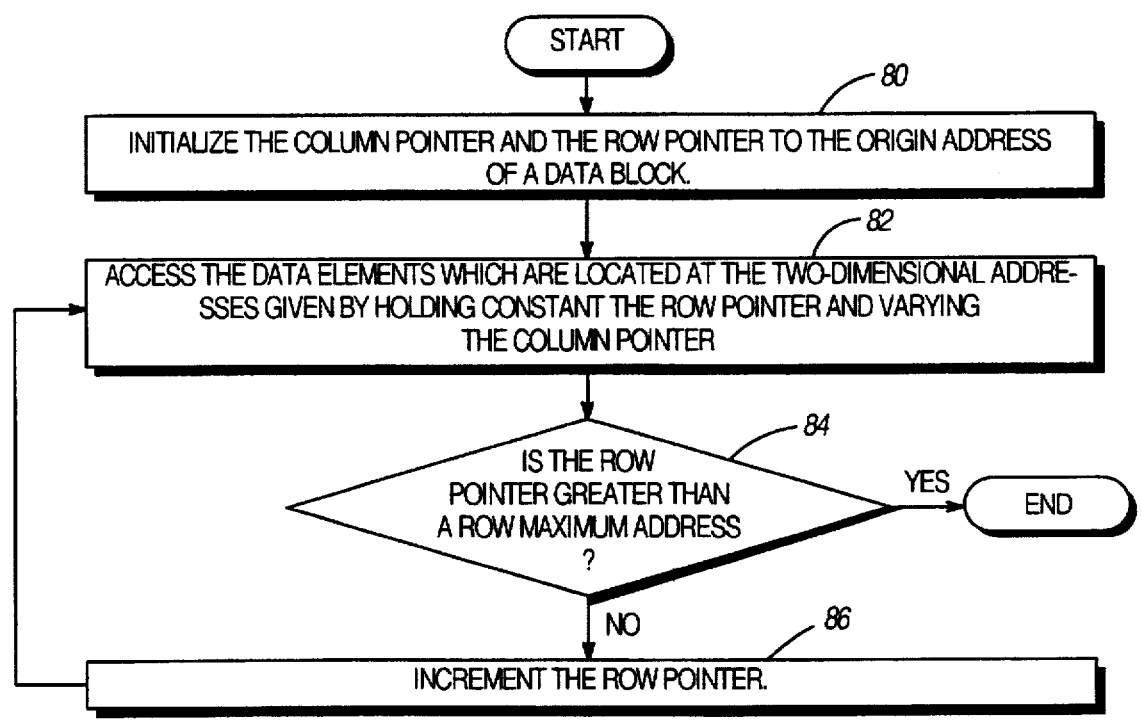
FIG. 5 shows a flow diagram of a method of row accessing data elements in a data block in accordance with an embodiment of the present invention.

FIG. 5 shows a flow diagram of a method of row accessing data elements in a data block in accordance with an embodiment of the present invention. In box (80), a column pointer and row pointer are initialized to an origin address of a data block which is stored in the memory device. The column and row pointers are loadable counters or any other storage means which retain the column and row addresses, respectively, and allow the addresses to be periodically updated by either incrementing or decrementing. The column and row pointers provide the two-dimensional address of the data element which is currently being accessed.

Next, in box (82), a row of data elements in the data block is accessed. A row of data elements is defined as those elements which have the same row address. Data elements in a row are accessed by holding constant the row address given by the row pointer and then varying the row address from the row minimum address to the row maximum address. The row address may be varied by incrementing the contents of the row pointer. It will be apparent to one of ordinary skill in the art that the row address may also be varied from the row maximum address to the row minimum address by decrementing the contents of the row pointer. Additionally, it will be understood by one of ordinary skill that data elements located in the same row may be simultaneously accessed.

In decision box (84), a check is made to determine whether the row address given by the row pointer is greater than the row maximum address. If so, the method terminates. If not, the method proceeds to box (86).

In box (86), the contents of the row pointer are incremented. This allows the next row of the data block to be accessed. Upon exiting box (86), method returns to box (82).

Figure 6:
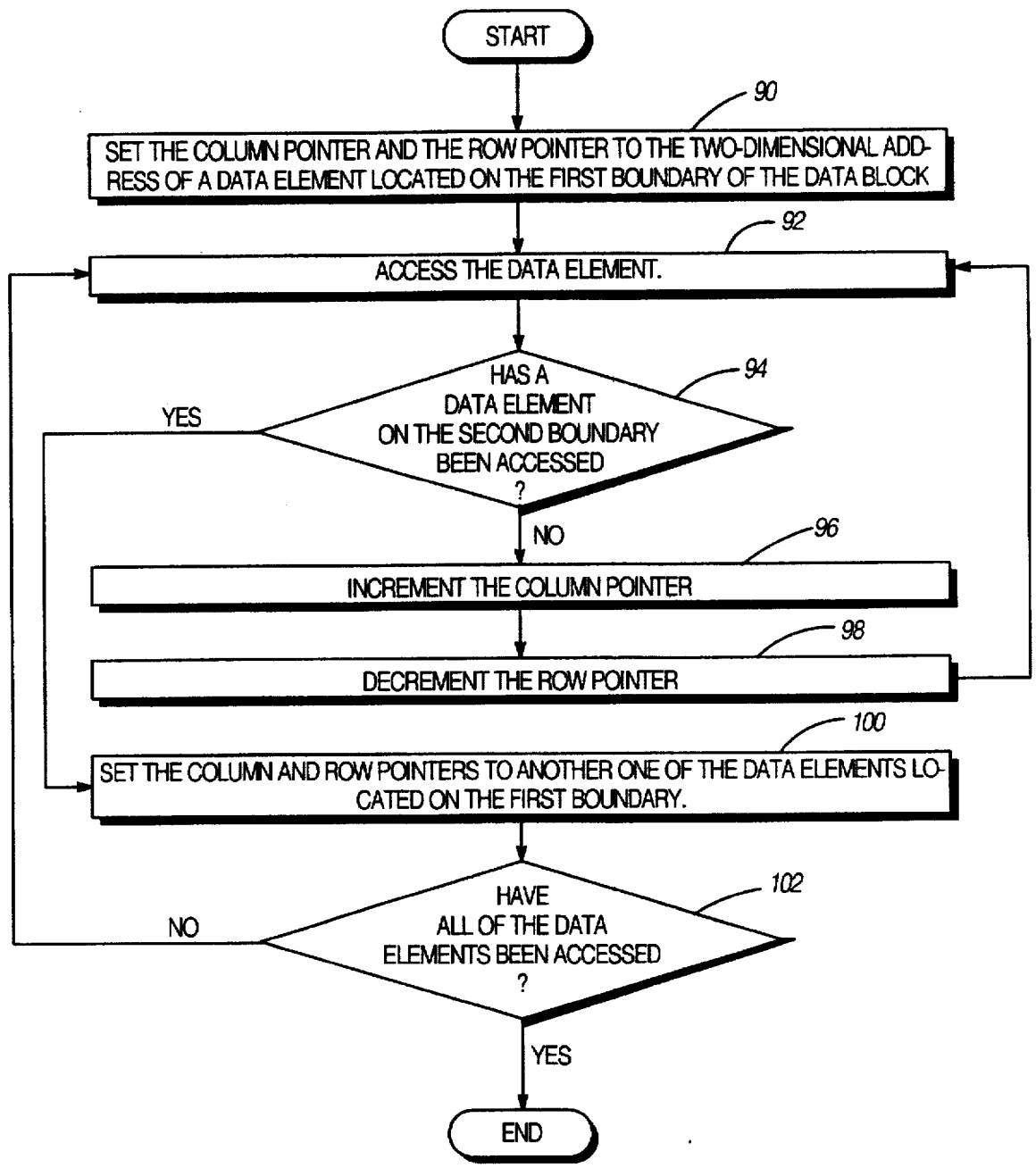
FIG. 6 shows a flow diagram of a method of diagonal accessing data elements in a data block in accordance with an embodiment of the present invention.

FIG. 6 shows a flow diagram of a method of diagonal accessing data elements in a data block in accordance with an embodiment of the present invention. In box (90), the column pointer and row pointer are set to a two-dimensional address of a data element which is located on the first boundary of the data block being accessed.

Next, in box (92), the data element located at the two-dimensional address given by the column and row pointers is accessed.

In decision box (94), a check is made to determine whether the data element accessed in box (92) is located on the second boundary of the data block. If so, the method proceeds to box (100). If not, the method proceeds to box (96).

In box (96), the contents of the column pointer is incremented.

In box (98), the contents of the row pointer is decremented. Upon exiting box (98), the method returns to box (92).

Box (100) is entered when all of the data elements located along a diagonal of the data block have been accessed. In box (100), the column pointer and row pointer are set to a two-dimensional address of another data element which is located on the first boundary of the data block being accessed.

Next, in decision box (102) a check is made to ascertain whether all of the data elements of data block have been accessed. If so, the method terminates. Otherwise, the method returns to box (92).

Figure 7:
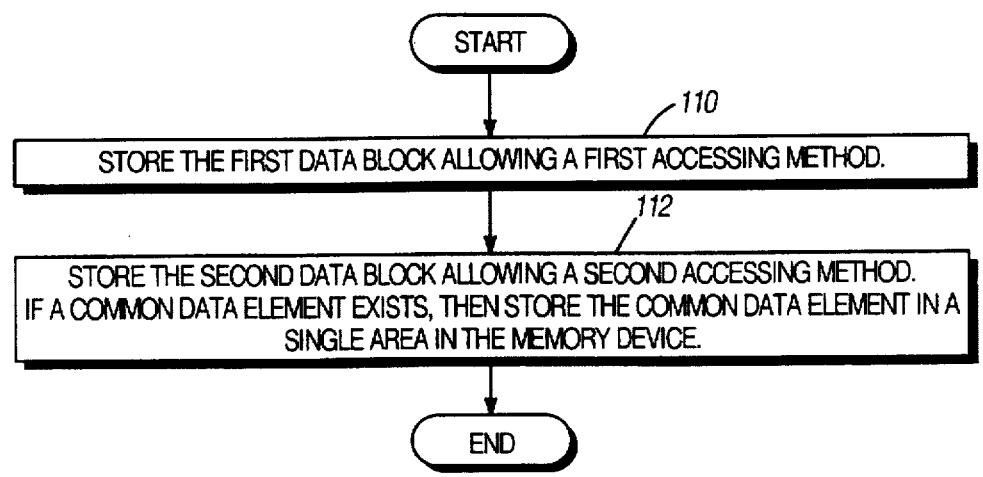
FIG. 7 shows a flow diagram of a method of storing two of a plurality of data blocks in a memory device in accordance with an embodiment of the present invention.

FIG. 7 shows a flow diagram of a method of storing two of a plurality of data blocks in a memory device in accordance with an alternative embodiment of the present invention. In box (110), a first data block, from the plurality of data blocks, is stored in the memory device in a manner which allows the data block to be accessed using a first accessing method. The first accessing method may be any accessing method such as a column accessing method, row accessing method, or diagonal accessing method. Column, row, and diagonal accessing methods are described in greater detail by FIGS. 4, 5, and 6, respectively.

Next, in box (112), a second data block, from the plurality of data blocks, is stored in the memory device in a manner which allows the data block to be accessed using a second accessing method. The second accessing method may be any accessing method which differs from the first accessing method such as a column accessing method, row accessing method, or diagonal accessing method. Additionally, the two data blocks are stored such that a common data element is stored in a single location in the memory device. A common data element is defined as a data element which is located in both data blocks, has the same value in both blocks, and may be stored at the same two-dimensional address.

Figure 8:
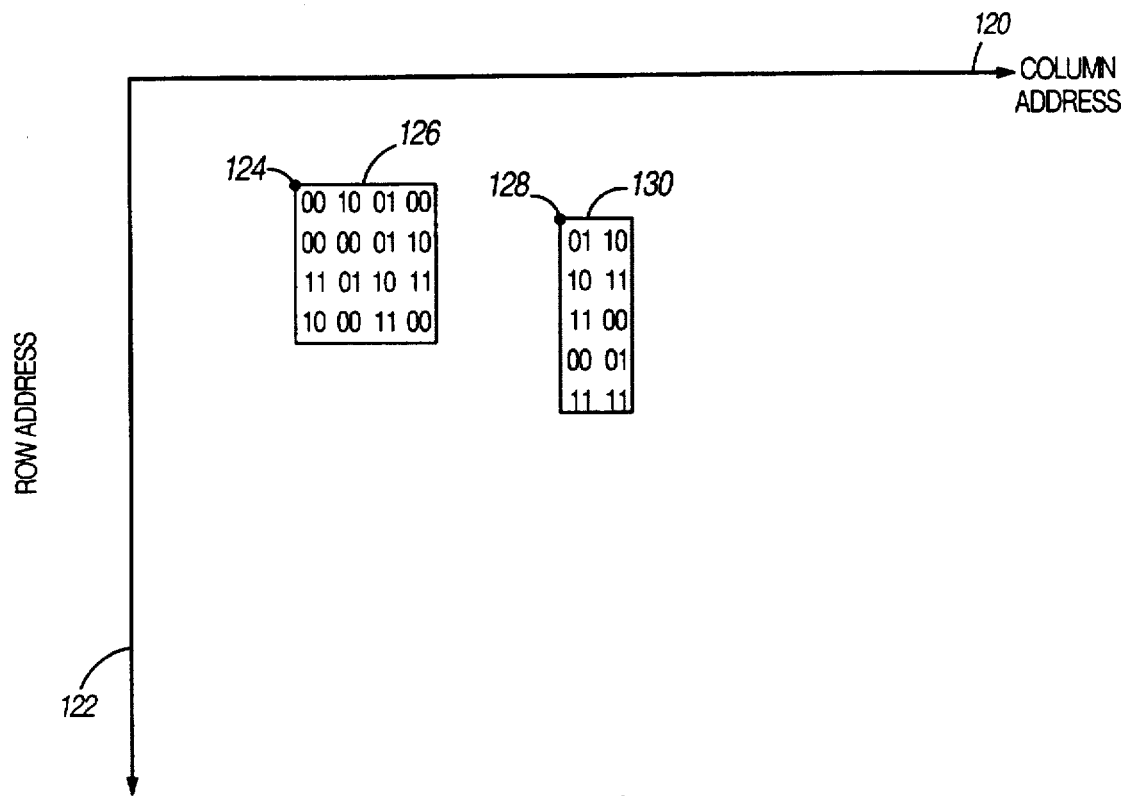
FIG. 8 illustrates an example of two data blocks located in non-overlapping areas of a two-dimensional address space.

FIG. 8 illustrates an example of two data blocks located in non-overlapping areas of a two-dimensional address space. Data block (126) includes sixteen two-bit digital words and is referenced by origin address (124). Data block (130) includes ten two-bit digital words and is referenced by origin address (128). Axis (120) indicates the column address and axis (122) indicates the row address of the two-dimensional address space.

Figure 9:
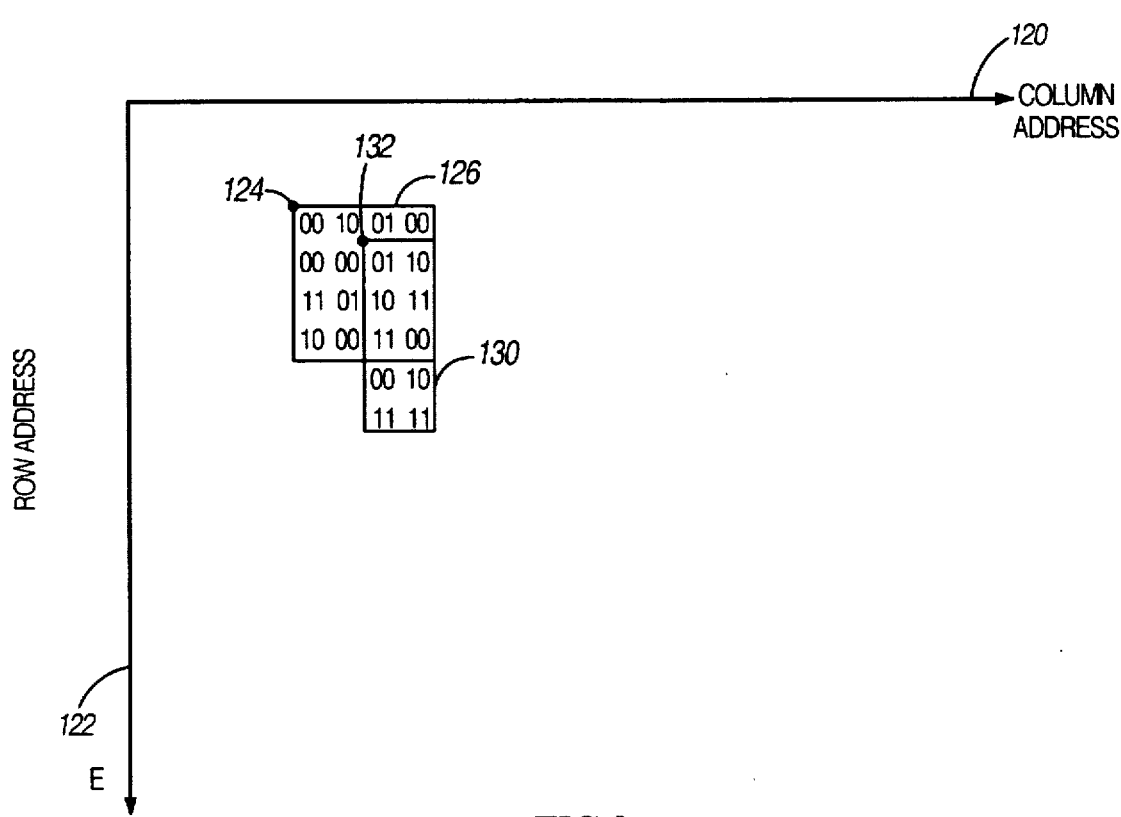
FIG. 9 illustrates an example of the two data blocks of FIG. 8 located in overlapping areas of a two-dimensional address space in accordance with an embodiment of the present invention.

FIG. 9 illustrates an example of the two data blocks of FIG. 8 located in overlapping areas of a two-dimensional address space in accordance with one embodiment of the present invention. Data block (126) remains at the location given by origin address (124). However, data block (130) is moved to new origin address (132). The new location of data block (130) allows data elements from both blocks having the same value to share the same two-dimensional addresses. Data elements which are from different data blocks, which have the same value, and which may be stored at the same two-dimensional address are referred to as common data elements.

By overlapping data blocks such that common data elements are created, the present invention reduces the amount of memory space required to store one or more data blocks.

FIGS. 8 and 9 illustrate two-bit data elements for purposes of example. Further, FIGS. 3, 8, and 9 each are described in terms of two-dimensional addressing. One with ordinary skill in the art will recognize that any arbitrary data elements could be used, including data elements which contain any number of digital bits, and that addressing could be performed in an n-dimensional sense.

Figure 10:
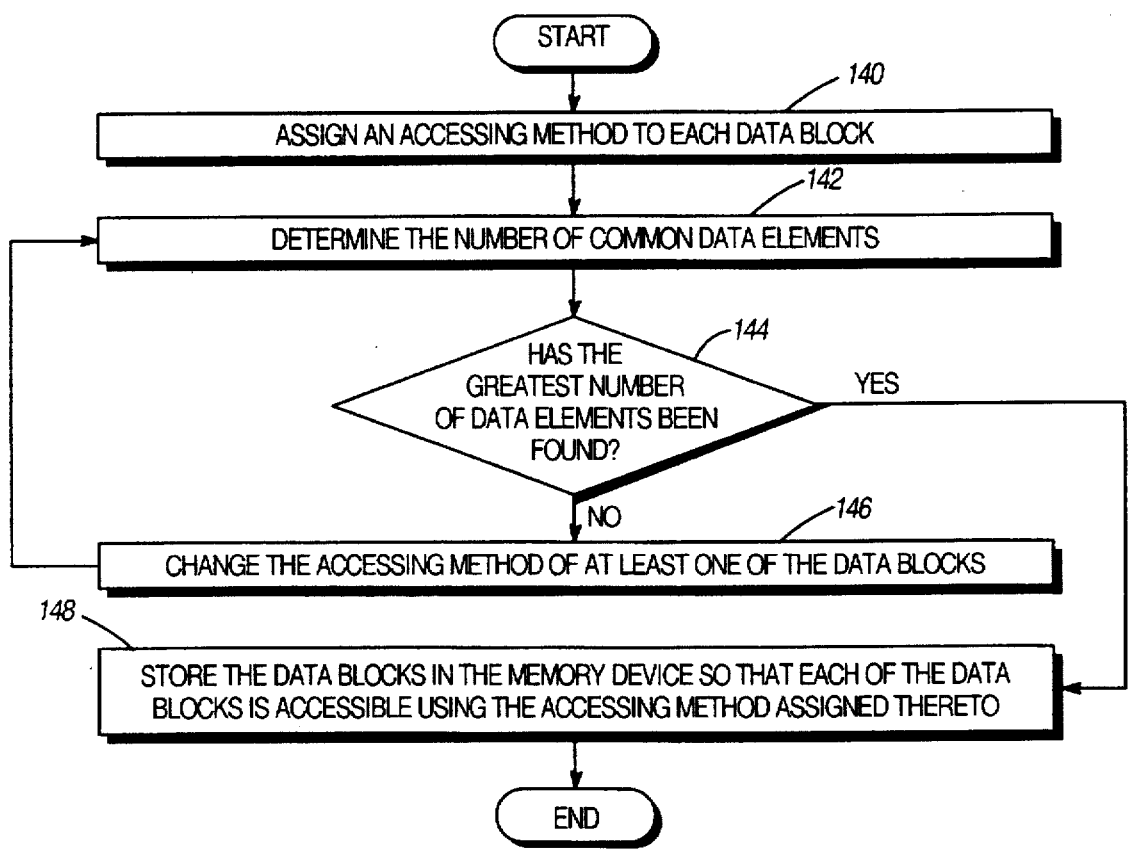
FIG. 10 shows a flow diagram of a method of storing a plurality of data blocks in a memory device in accordance with a preferred embodiment of the present invention.

FIG. 10 shows a flow diagram of a method of storing a plurality of data blocks in a memory device in accordance with a preferred embodiment of the present invention. In box (140), an accessing method is assigned to each of the plurality of data blocks.

In box (142), the number of common data elements among the plurality of data blocks is determined. The techniques used to determine the number of common data elements are disclosed in above-identified related invention No. 2.

In decision box (144), a check is made to determine whether the greatest number of common data elements has been found. If so, the method proceeds to box (148). If not, the method continues to box (146).

In box (146), the accessing method of at least one of the data blocks is changed to alternative accessing method such as one of the three accessing methods described by FIGS. 4, 5, or 6. Upon exiting box (146), the method returns to box (142).

In box (148), the data blocks are stored in the memory device. Each data block is accessible using the accessing method assigned to it which results in the greatest number of common data elements.

Figure 11:
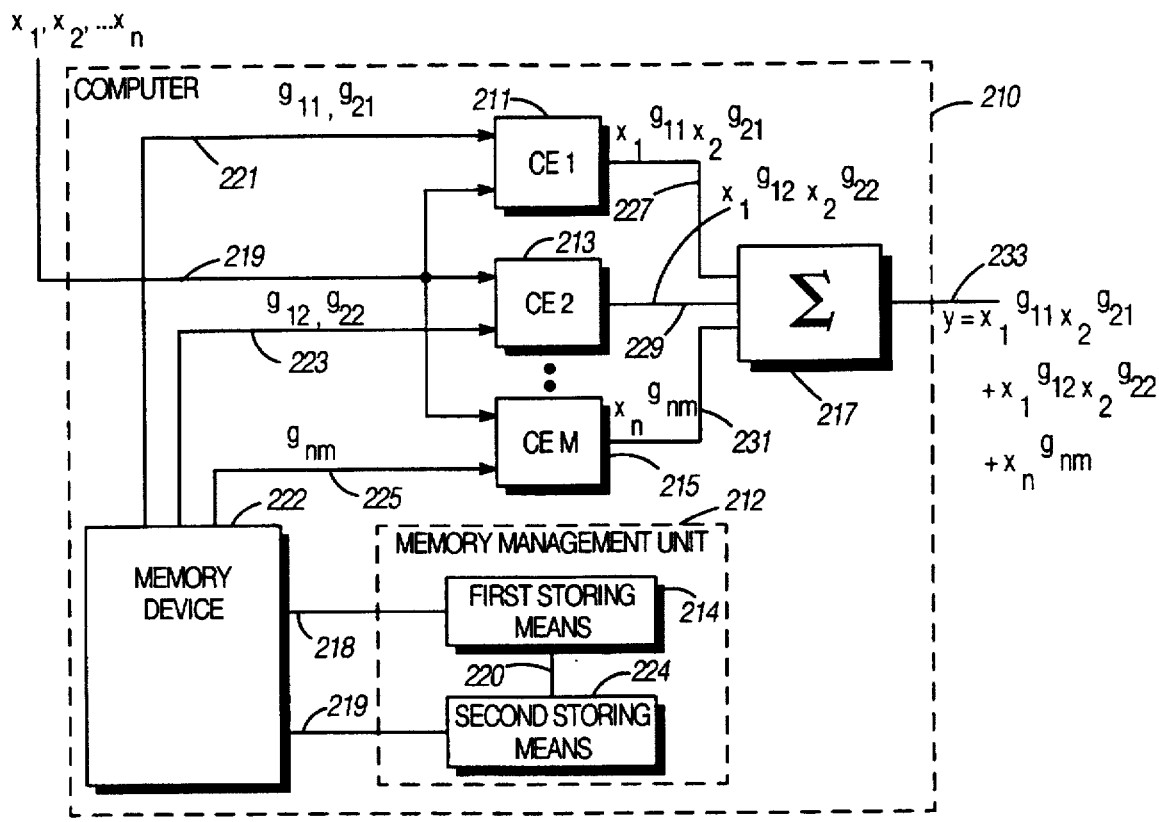
FIG. 11 shows a block diagram of a multiprocessor computer which includes a memory management unit of one embodiment of the present invention.

FIG. 11 shows a block diagram of a multiprocessor computer which includes a memory management unit of one embodiment of the present invention. Computer (210) includes memory device (222), memory management unit (212), summing circuit (217), and a plurality of computing elements, three of which are shown as computing elements (211), (213), and (215).

Computer (210) is used to compute polynomial expansions of the form:

$$y = \sum_{i=1}^{m} w_{i-1} x_1^{g_{1i}} x_2^{g_{2i}} \ldots x_n^{g_{ni}} \tag{1}$$

where y represents the output of computer (210), which may also be referred to as a dependent variable of the polynomial expansion; where $w_{i-1}$ represents the coefficient of the ith term; where $x_1, x_2, \ldots, x_n$ represent data inputs to computer (210), which may also be referred to as independent variables of the polynomial expansion; and where $g_{1i}, \ldots, g_{ni}$ represent the exponents for the ith term in the expansion which are applied to the data inputs; and where i, m, and n are integers.

A polynomial expansion is computed by computer (210) in the following manner. A plurality of data inputs $x_1, x_2, \ldots, x_n$ are fed into computer (210) using bus (219) and then distributed to the plurality of computing elements, of which computing elements (211), (213), and (215) are illustrated. It will be understood by one of ordinary skill that additional computing elements (not shown) could be provided to implement each of the terms of the polynomial expansion present in Equation 1 above. Each computing element computes a term in the polynomial expansion wherein the term includes zero or more data elements. The computing elements access exponent values which are stored in memory device (222). After computing a term, a computing element passes the term to summing circuit (217) which sums the terms computed by the computing elements and places the sum on computer output (233).

For example, FIG. 11 depicts the computation of the polynomial $y = x_1^{g_{11}} x_2^{g_{21}} + x_1^{g_{12}} x_2^{g_{22}} + \ldots x_n^{g_{nm}}$. In this example, computing element (211) accesses exponents $g_{11}$ and $g_{21}$ from memory device (222) using bus (221), while computing element (213) accesses exponents $g_{12}$ and $g_{22}$ from memory device (222) using bus (223), and computing element (215) accesses exponent $g_{nm}$ from memory device (222) using bus (225). Computing element (211) computes the term $x_1{}^s11\ x_2{}^s21$ and then sends it to summing circuit (217) over bus (227); computing element (213) computes the term $x_1{}^s12\ x_2{}^s22$ and then sends it to summing circuit (217) over bus (229); and computing element (15) computes the term $x_n{}^snm$ and then sends it to summing circuit (217) over bus (231). Upon receiving the terms from the computing elements, summing circuit (217) sums the terms and places the resulting polynomial expansion on computer output (233).

It will be apparent to one of ordinary skill that computer (210) is capable of computing polynomials of the form given by Equation 1 which have a number of terms different from the above example, and polynomials whose terms are composed of data inputs different from those of the above example.

Memory device (222) retains exponent values which are used by the plurality of computing elements. Memory device (222) may retain one or more blocks of exponent values, wherein each of the blocks corresponds to a different polynomial expansion.

Memory management unit (212) includes first storing means (214) and second storing means (224). First storing means (214) is operatively connected to memory device (222) by bus (218), and second storing means (224) is operatively connected to memory device (222) by bus (219). First memory means (214) and second memory means (224) are connected by bus (220).

In accordance with the present invention, memory management unit (212) stores a plurality of blocks of exponent values in memory device (222) in a fashion which reduces the amount of memory space needed to store the plurality of blocks. In one embodiment of the present invention, the memory management unit (212) is implemented by software running on a processor such as a microprosessor. However, one of ordinary skill in the art will recognize that memory management unit (212) could likewise be implemented in hardware using a programmable logic array, an ASIC or similar digital logic.

To reduce the needed amount of memory space, first storing means (214) stores a first data block, selected from a plurality of data blocks, in memory device (222) so that the first data block is accessible using an accessing method such as one of the accessing methods given by FIGS. 4, 5, or 6. Second storing means (224) assigns an accessing method to a second data block and then determines whether the two blocks have exponents which are the common data elements information used to determine whether there are common data elements is exchanged between first storing means (214) and second storing means (224) via bus (220). If at least one common data element exists between the two data blocks, first storing means (214) and second storing means (224) signal memory device (222) via bus (218) and bus (219), respectively, to store the blocks such that exponents which are common data elements are stored at common locations in memory device (222).

Figure 12:
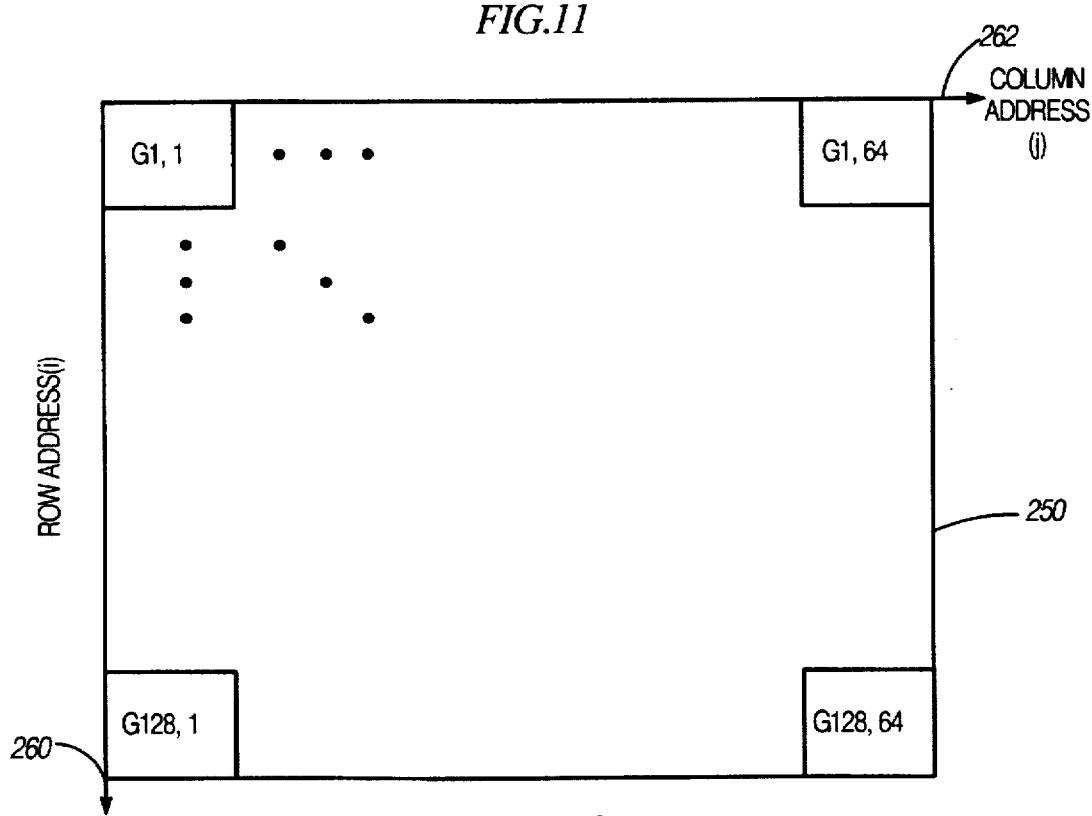
FIG. 12 illustrates an example of a data block which contains exponent values used in an embodiment of the present invention.

FIG. 12 illustrates an example of a data block which contains exponent values. In accordance with an embodiment, data block (250) includes a plurality of data elements, wherein each data element represents an exponent value as a two bit digital word. First data element (252) represents exponent $g_{1,1}$ and last data element (254) represents exponent $g_{128,64}$. The exponent values of data block (250) are used to compute polynomial expansions of the form given by Equation 1.

Each exponent is located at a two-dimensional address, (i, j), in a memory device, wherein i represents a row address and j represents a column address. Axis (260) represents values of the row address, while axis (262) represents values of the column address.

Data block (250) may be stored in memory device (222) of FIG. 11. In such a case, exponent values may be stored in memory device (222) such that each column address may point to exponent values that are accessed by a specific one of the plurality of computing elements of computer (210) of FIG. 11, and each row address may point to exponents that are applied to a specific one of the plurality of data inputs. For example, data block (250) may be used in computer (210) to provide exponent values for 64 computing elements and 128 data inputs.

Although FIG. 12 shows a data blocks which has 128 row addresses and 64 column addresses, and 128×64 exponent values, one of ordinary skill will understand that a data block may have any number of row and column addresses and any number of exponent values. Also, one skilled in the art will realize that when data block (250) is stored in memory device (222), the row and column addresses may be interchanged to point at exponents accessed by a specific computing element and to point at exponents corresponding to a specific data input, respectively.

SUMMARY

Thus there has been described herein a concept, as well as several embodiments including a preferred embodiment, of a method for storing data in a memory device which reduces the amount of memory space needed for the data.

Because the various embodiments of methods of storing data as herein-described allow data blocks to overlap when stored in a memory device, they significantly decrease the amount of memory space required to store the blocks, as well as lessening the need for swapping data blocks between a memory device and a mass storage device.

It will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. In a computer including a memory device, a method of storing a plurality of data blocks in the memory device, the method comprising the following steps:

assigning to each of the plurality of data blocks an accessing method, each of the data blocks having a plurality of data elements;

changing an assigned accessing method of at least one of the plurality of data blocks to an alternative accessing method, which is not the same as the assigned accessing method, in order to produce a plurality of common data elements among the data blocks; and storing the plurality of data blocks in the memory device, wherein the plurality of data blocks are accessible using the assigned accessing method and the alternative accessing method and the common data elements are non-redundantly stored in the memory device.

2. The method of claim 1 wherein each of data elements is a digital word which is n bits in length, wherein n is an integer.

3. The method of claim 2 wherein n is two.

4. The method of claim 1 wherein each of the plurality of data elements represents an exponent in a polynomial expansion.

5. The method of claim 4 wherein the polynomial expansion has the form:

$$y = \sum_{i=1}^{m} x_1^{g_{1i}} x_2^{g_{2i}} \ldots x_n^{g_{ni}}$$

wherein y represents a dependent variable;
wherein i, m, and n are integers;
wherein $x_1, x_2, \ldots, x_n$ represent independent variables; and wherein $g_{1i}, \ldots, g_{ni}$ represent the exponents for the ith term in the expansion and which are applied to the independent variables.

6. The method of claim 1 wherein each of the plurality of data elements is accessible using a n-dimensional address which has a column pointer and a row pointer, wherein n is an integer.

7. The method of claim 6 wherein n is two.

8. The method of claim 6, wherein the accessing method assigned to at least one of the plurality of data blocks comprises the following steps:
 (i) initializing the column pointer and row pointer to an origin address of the at least one of the plurality of data blocks; and
 (ii) accessing ones of the plurality of data elements which are located at the two-dimensional addresses given by holding constant the column pointer and varying the row pointer.

9. The method of claim 8 further comprising the steps of:
 (iii) comparing the column pointer with a maximum column address;
   (A) if the column pointer is greater than the maximum column address, then terminating the accessing method;
   (B) if the column pointer is less than or equal to the maximum column address, then incrementing the column pointer; and
 (iv) returning to step (ii).

10. The method of claim 6, wherein the accessing method assigned to at least one of the plurality of data blocks comprises the following steps:
 (i) initializing the column pointer and row pointer to an origin address of the at least one of the plurality of data blocks; and
 (ii) accessing ones of the plurality of data elements which are located at the two-dimensional addresses given by holding constant the row pointer and varying the column pointer.

11. The method of claim 10 further comprising the steps of:
 (iii) comparing the row pointer with a maximum row address;
   (A) if the row pointer is greater than the maximum row address, then terminating the accessing method;
   (B) if the row pointer is less than or equal to the maximum row address, then incrementing the row pointer; and
 (iv) returning to step (ii).

12. The method of claim 6, wherein the accessing method assigned to at least one of the plurality of data blocks comprises the following steps:
 (i) setting the column pointer and row pointer to the two-dimensional address of one of the plurality of data elements which is located on a first boundary of the data block being accessed;
 (ii) accessing the data element which is located at the two-dimensional address given by the column pointer and the row pointer;
 (iii) incrementing the column pointer;
 (iv) decrementing the row pointer;
 (v) repeating steps (ii)–(iv) until accessing a data element which is located on a second boundary of the data block being accessed;
 (vi) setting the column pointer and row pointer to the two-dimensional address of another one of the plurality of data elements which is located on the first boundary of the data block being accessed;
 (vii) repeating steps (i)–(vi) until all of the plurality of data elements have been accessed.

13. In a computer which includes a memory device, a memory management unit for storing a plurality of data blocks in the memory device, each of the plurality of data blocks having a plurality of data elements, the memory management unit comprising:
 first storing means operatively coupled to the memory device, for assigning to each of the plurality of data blocks an accessing method;
 means for changing the assigned accessing method of at least one of the plurality of data blocks to an alternative accessing method, which is not the same as the assigned accessing method, in order to produce a plurality of common data elements; and
 second storing means, operatively coupled to the memory device and the first storing means, for storing the plurality of data blocks in the memory device, wherein the plurality of data blocks are accessible using the assigned accessing method and the alternative accessing method and the common dam elements are non-redundantly stored in the memory device.

14. The memory management unit of claim 13 wherein each of data elements is a digital word which is n bits in length, wherein n is an integer.

15. The memory management unit of claim 14 wherein n is two.

16. The memory management unit of claim 13 wherein each of the plurality of data elements represents an exponent in a polynomial expansion.

17. The memory management unit of claim 16 wherein the polynomial expansion has the form:

$$y = \sum_{i=1}^{i=m} x_1^{g_{1i}} x_2^{g_{2i}} \ldots x_n^{g_{ni}}$$

wherein y represents a dependent variable;
wherein i, m, and n are integers;
wherein $x_1, x_2, \ldots, x_n$ represent independent variables; and
wherein $g_{1i}, \ldots, g_{ni}$ represent the exponents for the ith term in the expansion and which are applied to the independent variables.

18. The memory management unit of claim 13 wherein each of the plurality of data elements is accessible using a n-dimensional address which has a column pointer and a row pointer, wherein n is an integer.

19. The memory management unit of claim 18 wherein n is two.

20. The memory management unit of claim 18, wherein the first accessing method includes row accessing and the second method includes diagonal accessing.

21. The memory management unit of claim 18, wherein the first accessing method includes column accessing and the second method includes diagonal accessing.

22. The method of claim 21, wherein the diagonal accessing includes the following steps:
   (i) setting the column pointer and row pointer to the two-dimensional address of one of the plurality of data elements which is located on a first boundary of the second data block;
   (ii) accessing the data element which is located at the two-dimensional address given by the column pointer and the row
   (iii) incrementing the column pointer;
   (iv) decrementing the row pointer;
   (v) repeating steps (ii)–(iv) until accessing a data element which is located on a second boundary of the second data block;
   (vi) setting the column pointer and row pointer to the two-dimensional address of another one of the plurality of data elements which is located on the first boundary of the second data block;
   (vii) repeating steps (i)–(vi) until all of the plurality of data elements have been accessed.

23. The memory management unit of claim 18, wherein the first accessing method includes column accessing and the second method includes row accessing.

24. The method of claim 23, wherein the column accessing includes the following steps:
   (i) initializing the column pointer and row pointer to an origin address of the first data block; and
   (ii) accessing ones of the plurality of data elements which are located at the two-dimensional addresses given by holding constant the column pointer and varying the row pointer.

25. The method of claim 24 further comprising the steps of:
   (iii) comparing the column pointer with a maximum column address;
      (A) if the column pointer is greater than the maximum column address, then terminating the column accessing;
      (B) if the column pointer is less than or equal to the maximum column address, then incrementing the column pointer; and
   (iv returning to step (ii).

26. The method of claim 23, wherein the row accessing includes the following steps:
   (i) initializing the column pointer and row pointer to an origin address of the second data block; and
   (ii) accessing ones of the plurality of data elements which are located at the two-dimensional addresses given by holding constant the row pointer and varying the column pointer.

27. The method of claim 26 further comprising the steps of:
   (iii) comparing the row pointer with a maximum row address;
      (A) if the row pointer is greater than the maximum row address, then terminating the row accessing;
      (B) if the row pointer is less than or equal to the maximum row address, then incrementing the row pointer; and
   (iv) returning to step (ii).

28. In a computer including a memory device, a method of storing a plurality of data blocks in the memory device, the method comprising the following steps:

assigning to each of the plurality of data blocks an accessing method in order to generate a plurality of assigned accessing methods;

replacing at least one of the assigned accessing methods with an alternative accessing method different therefrom in order to produce a plurality of common data elements among the data blocks; and storing the plurality of data blocks in the memory device, wherein the plurality of data blocks are accessible according to the assigned accessing methods and the common data elements are non-redundantly stored in the memory device.

29. In a computer including a memory device and a plurality of buffers, a method of storing a plurality of data blocks in the memory device, the method comprising the following steps:

assigning to each of the plurality of data blocks an accessing method in order to generate a plurality of assigned accessing methods, each of the assigned accessing methods being selected from a first group consisting of a column accessing method, a diagonal accessing method, and a row accessing method;

storing a plurality of origin addresses of the of data blocks in the plurality of buffers;

replacing at least one of the assigned accessing methods with an alternative accessing method, different therefrom and selected from the first group, in order to produce a plurality of common data elements among the data blocks; and storing the plurality of data blocks in the memory device, wherein the common data elements are non-redundantly stored in the memory device and the plurality of data blocks are accessible by the computer updating the origin addresses according to the assigned accessing methods.

* * * * *

UNITED STATES PATENT AND TRADEMARK OFFICE
CERTIFICATE OF CORRECTION

PATENT NO. : 5,737,768
DATED : April 7, 1998
INVENTOR(S) : Scott E. Lloyd

It is certified that error appears in the above-indentified patent and that said Letters Patent is hereby corrected as shown below:

Column 12, line 34, claim 13 "dam" should be --data"

Column 13, line 12 after "row" insert --pointer--

Column 13, line 45, after "iv" insert --)--

On title page item: Assignee: Schaumberg should be Schaumburg

Signed and Sealed this

Twenty-sixth Day of October, 1999

Attest:

Q. TODD DICKINSON

Attesting Officer

Acting Commissioner of Patents and Trademarks